US009184290B2

(12) United States Patent
Cheng et al.

(10) Patent No.: US 9,184,290 B2
(45) Date of Patent: Nov. 10, 2015

(54) METHOD OF FORMING WELL-CONTROLLED EXTENSION PROFILE IN MOSFET BY SILICON GERMANIUM BASED SACRIFICIAL LAYER

(71) Applicant: International Business Machines Corporation, Armonk, NY (US)

(72) Inventors: Szu-lin Cheng, Yorktown Heights, NY (US); Jack O. Chu, Manhasset Hills, NV (US); Isaac Lauer, Yorktown Heights, NY (US); Jeng-Bang Yau, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 13 days.

(21) Appl. No.: 14/242,955

(22) Filed: Apr. 2, 2014

(65) Prior Publication Data

US 2015/0287826 A1    Oct. 8, 2015

(51) Int. Cl.
| | |
|---|---|
| *H01L 21/20* | (2006.01) |
| *H01L 29/78* | (2006.01) |
| *H01L 21/02* | (2006.01) |
| *H01L 29/16* | (2006.01) |
| *H01L 29/161* | (2006.01) |
| *H01L 29/165* | (2006.01) |
| *H01L 29/15* | (2006.01) |
| *H01L 29/66* | (2006.01) |
| *H01L 21/324* | (2006.01) |
| *H01L 21/225* | (2006.01) |
| *H01L 21/306* | (2006.01) |
| *H01L 21/308* | (2006.01) |

(52) U.S. Cl.
CPC ...... *H01L 29/7848* (2013.01); *H01L 21/02532* (2013.01); *H01L 21/2251* (2013.01); *H01L 21/308* (2013.01); *H01L 21/30604* (2013.01); *H01L 21/324* (2013.01); *H01L 29/15* (2013.01); *H01L 29/16* (2013.01); *H01L 29/161* (2013.01); *H01L 29/165* (2013.01); *H01L 29/6656* (2013.01); *H01L 29/66545* (2013.01)

(58) Field of Classification Search
CPC .............. H01L 21/02027; H01L 21/20; H01L 21/76297; H01L 21/76808
See application file for complete search history.

(56) References Cited

U.S. PATENT DOCUMENTS

| | | | |
|---|---|---|---|
| 6,989,322 B2 | 1/2006 | Gluschenkov et al. | |
| 7,018,901 B1 | 3/2006 | Thean et al. | |

(Continued)

FOREIGN PATENT DOCUMENTS

JP    2007329211 A    12/2007

*Primary Examiner* — Mohammad Choudhry
(74) *Attorney, Agent, or Firm* — Scully, Scott, Murphy & Presser P.C.; Louis J. Percello, Esq.

(57) ABSTRACT

The present disclosure provides a method to improve and control the source/drain extension profile, which is compatible with device scaling. First, a sacrificial layer portion interposed between a channel layer portion and an uppermost surface of a semiconductor substrate having trenches is laterally recessed to provide a lateral recess on each side of the sacrificial layer portion. After filling the lateral recesses and trenches with a doped semiconductor material, a source/drain extension region is formed by a subsequent anneal during which dopants in the doped semiconductor material diffuse into portions of the channel layer portion over the lateral recesses and portions of the semiconductor substrate adjacent the lateral recesses.

20 Claims, 4 Drawing Sheets

(56) References Cited

U.S. PATENT DOCUMENTS

| | | |
|---|---|---|
| 7,023,055 B2 | 4/2006 | Ieong et al. |
| 7,329,923 B2 | 2/2008 | Doris et al. |
| 7,935,590 B2 | 5/2011 | Lan et al. |
| 8,138,053 B2 | 3/2012 | Utomo et al. |
| 8,288,754 B2 | 10/2012 | Bidal et al. |
| 2005/0116290 A1 | 6/2005 | de Souza et al. |
| 2006/0151837 A1 | 7/2006 | Chen et al. |
| 2011/0165739 A1 | 7/2011 | Majumdar et al. |
| 2011/0227162 A1 | 9/2011 | Lin et al. |

METHOD OF FORMING WELL-CONTROLLED EXTENSION PROFILE IN MOSFET BY SILICON GERMANIUM BASED SACRIFICIAL LAYER

BACKGROUND

The present disclosure relates to a semiconductor structure and a method of forming the same. More particularly, the present disclosure relates to a semiconductor structure having a well-controlled extension profile and a method of forming the same.

As semiconductor devices shrink in each generation of semiconductor technology, it is more desirable to achieve step-function like source/drain extension profiles and high doping concentrations (on the order of $10^{21}$ atoms/cm$^3$ or greater) for better device performance as well as process control. By "step-like source/drain extension profiles" it is meant to be atomically or near-atomically abrupt doping transitions.

Typical source/drain extension profiles formed by ion implantation or atomic layer doping are now insufficient. Ion implantation is difficult to control a junction depth below 10 nm and the junction depth is highly dependent on thermal diffusion, while atomic layer doping requires a long drive-in path and usually afterwards the dopant-profile will lose its abruptness. Moreover, any additional thermal processing which is performed after the formation of the source/drain extensions can further decrease the profile abruptness.

There is thus a need to provide a method to improve and control the extension profile, which is compatible to device scaling.

SUMMARY

The present disclosure provides a method to improve and control the source/drain extension profile, which is compatible with device scaling. More particularly, the present disclosure provides a method to provide a semiconductor structure with step-function like source/drain extension profiles and high doping concentrations (on the order of $10^{21}$ atoms/cm$^3$ or greater). The above can be achieved in the present disclosure by using a sacrificial layer to structurally improve the junction depth control. A shallow junction depth is formed by laterally recessing a sacrificial layer portion interposed between a channel layer portion and an uppermost surface of a semiconductor substrate having trenches to provide a lateral recess on each side of the sacrificial layer portion and filling the lateral recesses and trenches with a doped semiconductor material. The source/drain extension profile is then formed by a subsequent drive-in anneal to diffuse dopants from the doped semiconductor material into portions of the channel layer portion over the lateral recesses and portions of the semiconductor substrate adjacent the lateral recesses. Because the resulting junction depth has a shorter link-up path than that of the atomic layer doping process, less drive-in diffusion is required to form the source/drain extension profile in the present disclosure.

In one aspect of the present disclosure, a method of forming a semiconductor structure is provided. The method includes first forming a sacrificial layer on a semiconductor substrate. A channel layer is then formed on the sacrificial layer. Next, at least one gate structure is provided on the channel layer. The at least one gate structure has a spacer located on each of vertical sidewalls of the at least one gate structure. Next, exposed portions of the channel layer and portions of the sacrificial layer and the semiconductor substrate located beneath the exposed portions of the channel layer are recessed utilizing the at least one gate structure and the spacer as an etch mask. The recessing forms trenches in the semiconductor substrate. Next, a remaining portion of said sacrificial layer is laterally recessed selectively with respect to the channel layer and the semiconductor substrate by a lateral distance to provide a lateral recess in each side of the remaining portion of the sacrificial layer. Next, a doped semiconductor material is deposited in the trenches and the lateral recesses. Subsequently, the doped semiconductor material is annealed. During the annealing dopants of the semiconductor material diffuse into portions of the semiconductor substrate adjacent said lateral recesses to form a first doped region and into portions of the channel layer over said lateral recesses to form a second doped region.

In another aspect of the present disclosure, a semiconductor structure having an abrupt source/drain extension profile is provided. By "abrupt" it is meant to have an atomically or near-atomically doping transition up to a $10^{21}$ doping concentrations. In accordance with the present disclosure, the semiconductor structure includes a semiconductor substrate comprising at least one mesa semiconductor structure and adjoining recessed surface semiconductor portions. The at least one mesa semiconductor structure includes a first doped region at each side of an uppermost portion of the at least one mesa semiconductor structure. A sacrificial layer portion located on an undoped portion of an uppermost surface of the at least one mesa semiconductor structure. The sacrificial layer portion is laterally offset with respect to sidewalls of the mesa semiconductor structure to form a lateral recess on each side of the sacrificial layer portion. A channel layer portion is located on the sacrificial layer portion. The channel layer portion includes a channel region in contact with the sacrificial layer portion and a second doped region located on portions of lateral protrusions of the channel layer portion with respect to the sacrificial layer portion. A first doped semiconductor material region is located within each of the lateral recesses. A bottommost surface of the first doped semiconductor material region is in contact with at least the first doped region and an uppermost surface of the first doped semiconductor material region is in contact with at least the second doped region. A gate structure located on the channel region of the channel layer portion. The gate structure includes a spacer present on each of vertical sidewalls of said gate structure. The spacer has a base present on at least the second doped region. A second doped semiconductor material region located on each of the recessed surface semiconductor portions of the semiconductor substrate. The second doped semiconductor material region comprises a same doped semiconductor material as that of said first doped semiconductor material region. In accordance with the present disclosure, the first doped region, the second doped region and the first doped semiconductor material region define a source/drain extension region. The first doped region and the second doped region are formed by diffusing dopants from the doped semiconductor material into respective portions of the channel layer portion and the at least one mesa semiconductor structure during annealing. The second doped semiconductor material region defines a source/drain region.

DETAILED DESCRIPTION

The present disclosure will now be described in greater detail by referring to the following discussion and drawings that accompany the present disclosure. It is noted that the drawings of the present disclosure are provided for illustrative purposes and, as such, they are not drawn to scale. In the following description, numerous specific details are set forth, such as particular structures, components, materials, dimensions, processing steps and techniques, in order to provide a thorough understanding of the present disclosure. However, it will be appreciated by one of ordinary skill in the art that the present disclosure may be practiced with viable alternative process options without these specific details. In other instances, well-known structures or processing steps have not been described in detail in order to avoid obscuring the various embodiments of the present disclosure.

The present disclosure provides a method to improve and control the source/drain extension profile, which is compatible with device scaling. Notably, the method of the present disclosure includes forming a sacrificial layer and a channel layer subsequently on an uppermost surface of a semiconductor substrate and providing at least one gate structure having a spacer located on a vertical sidewall thereof on the channel layer. Exposed portions of the channel layer and portions of the sacrificial layer and semiconductor substrate located beneath the exposed portions of the channel layer are then removed utilizing the at least one gate structure and the spacers as an etch mask. The remaining portions of the sacrificial layer are then laterally recessed to provide a lateral recess on each side of the remaining portions of the sacrificial layer. Next, a doped semiconductor material is deposited in the lateral recesses and trenches formed in the semiconductor substrate. Source/drain extension regions are formed by a subsequent drive-in anneal to diffuse dopants from the doped semiconductor material into portions of the channel layer over the lateral recesses and portions of the semiconductor substrate adjacent the lateral recesses. The method of the present disclosure is now described in greater detail.

Figure 1:
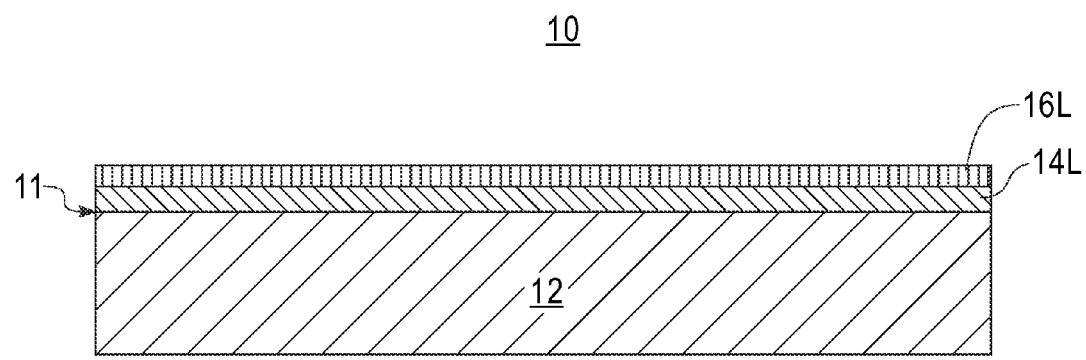
FIG. 1 is a cross-sectional view of a structure including a semiconductor substrate over which a sacrificial layer and a channel layer are subsequently formed in accordance with one embodiment of the present disclosure.

Referring to FIG. 1, there is illustrated an exemplary semiconductor structure 10 according to an embodiment of the present disclosure that includes a sacrificial layer 14L and a channel layer 16L located on a surface 11 of a semiconductor substrate 12.

In some embodiments of the present disclosure and as shown in FIG. 1, the semiconductor substrate 12 is a bulk semiconductor substrate. When a bulk semiconductor substrate is employed as semiconductor substrate 12, the bulk semiconductor substrate can be comprised of any semiconductor material including, but not limited to, Si, Ge, SiGe, SiC, SiGeC, InAs, GaAs, InP or other like III/V compound semiconductors. Multilayers of these semiconductor materials can also be used as the semiconductor material of the bulk semiconductor. In one embodiment, the semiconductor substrate 12 comprises a single crystalline semiconductor material, such as, for example, single crystalline silicon. In other embodiments, the semiconductor substrate 12 may comprise a polycrystalline or amorphous semiconductor material.

In another embodiment, a semiconductor-on-insulator (SOI) substrate (not specifically shown) is employed as the semiconductor substrate 12. When employed, the SOI substrate includes a handle substrate, a buried insulating layer located on an upper surface of the handle substrate, and a semiconductor layer located on an upper surface of the buried insulating layer. The handle substrate and the semiconductor layer of the SOI substrate may comprise the same, or different, semiconductor material. The term "semiconductor" as used herein in connection with the semiconductor material of the handle substrate and the semiconductor layer denotes any semiconducting material including, for example, Si, Ge, SiGe, SiC, SiGeC, InAs, GaAs, InP or other like III/V compound semiconductors. Multilayers of these semiconductor materials can also be used as the semiconductor material of the handle substrate and the semiconductor layer. In one embodiment, the handle substrate and the semiconductor layer are both comprised of silicon. In another embodiment, hybrid SOI substrates are employed which have different surface regions of different crystallographic orientations.

The handle substrate and the semiconductor layer may have the same or different crystal orientation. For example, the crystal orientation of the handle substrate and/or the semiconductor layer may be {100}, {110}, or {111}. Other crystallographic orientations besides those specifically mentioned can also be used in the present disclosure. The handle substrate and/or the semiconductor layer of the SOI substrate may be a single crystalline semiconductor material, a polycrystalline material, or an amorphous material. Typically, at least the semiconductor layer is a single crystalline semiconductor material.

The buried insulating layer of the SOI substrate may be a crystalline or non-crystalline oxide or nitride. In one embodiment, the buried insulating layer is an oxide. The buried insulating layer may be continuous or it may be discontinuous. When a discontinuous buried insulating region is present, the insulating region exists as an isolated island that is surrounded by semiconductor material.

The SOI substrate may be formed utilizing standard processes including for example, SIMOX (separation by ion implantation of oxygen) or layer transfer. When a layer transfer process is employed, an optional thinning step may follow the bonding of two semiconductor wafers together. The optional thinning step reduces the thickness of the semiconductor layer to a layer having a thickness that is more desirable.

The thickness of the semiconductor layer of the SOI substrate is typically from 100 Å to 1000 Å, with a thickness from 500 Å to 700 Å being more typical. In some embodiments, and when an ETSOI (extremely thin semiconductor-on-insulator) substrate is employed, the semiconductor layer of the SOI has a thickness of less than 100 Å. If the thickness of the semiconductor layer is not within one of the above mentioned ranges, a thinning step such as, for example, planarization or etching can be used to reduce the thickness of the semiconductor layer to a value within one of the ranges mentioned above.

The buried insulating layer of the SOI substrate typically has a thickness from 10 Å to 2000 Å, with a thickness from 1000 Å to 1500 Å being more typical. The thickness of the handle substrate of the SOI substrate is inconsequential to the present disclosure.

In some other embodiments, hybrid semiconductor substrates which have different surface regions of different crystallographic orientations can be employed as semiconductor substrate 12. When a hybrid substrate is employed, an nFET is typically formed on a (100) crystal surface, while a pFET is typically formed on a (110) crystal plane. The hybrid substrate can be formed by techniques that are well known in the art. See, for example, U.S. Pat. No. 7,329,923, U.S. Publication No. 2005/0116290, dated Jun. 2, 2005 and U.S. Pat. No. 7,023,055, the entire contents of each are incorporated herein by reference.

The semiconductor substrate 12 may be doped, undoped or contain doped and undoped regions therein. For clarity, the doped regions are not specifically shown in the drawings of the present disclosure. Each doped region within the semiconductor substrate 12 may have the same, or they may have different conductivities and/or doping concentrations. The doped regions that are present in the semiconductor substrate 12 are typically referred to as well regions and they are formed utilizing a conventional ion implantation process or gas phase doping.

The semiconductor substrate 12 can be processed to include at least one isolation region therein. For clarity, the at least one isolation region is not shown in the drawings of the present disclosure. The at least one isolation region can be a trench isolation region or a field oxide isolation region. The trench isolation region can be formed utilizing a conventional trench isolation process well known to those skilled in the art. For example, lithography, etching and filling of the trench with a trench dielectric such as an oxide may be used in forming the trench isolation region. Optionally, a liner may be formed in the trench prior to trench fill, a densification step may be performed after the trench fill and a planarization process may follow the trench fill as well. The field oxide isolation region may be formed utilizing a so-called local oxidation of silicon process. When present, the at least one isolation region provides isolation between neighboring gate structure regions, typically required when the neighboring gates have opposite conductivities, i.e., nFETs and pFETs. As such, the at least one isolation region separates an nFET device region from a pFET device region.

As is also shown in FIG. 1, the sacrificial layer 14L is deposited on an uppermost surface 11 of the semiconductor substrate 12 as a blanket layer, i.e., as an unpatterned contiguous layer. The sacrificial layer 14L can be composed of any semiconductor material that has a different etch rate than the semiconductor material of the semiconductor substrate 12.

Figure 2A:
FIG. 2A is a cross-sectional view of the sacrificial layer as a single layer thin film.

In some embodiments and a shown, for example, in FIGS. 1 and 2A of the present disclosure, the sacrificial layer 14L is a semiconductor thin film 14L1. In one example, and when the semiconductor substrate 12 is composed of silicon, the sacrificial layer 14L1 is composed of a germanium-containing semiconductor material. By "germanium-containing semiconductor material" it is meant a semiconductor material that includes at least germanium. Exemplary germanium-containing semiconductor materials that can be employed as the sacrificial layer 14L include a silicon germanium alloy containing from 10 to 99.99 weight percent germanium, pure germanium, doped germanium, and multilayers thereof.

Figure 2B:
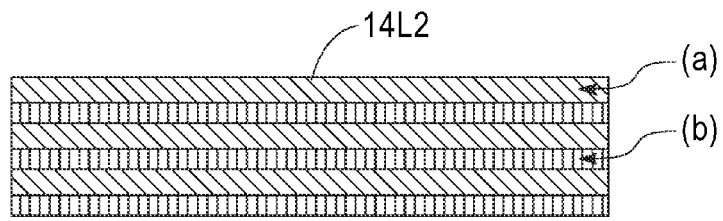
FIG. 2B is a cross sectional view of the sacrificial layer having a superlattice structure.

In some embodiments of the present disclosure and as shown in FIG. 2B, the sacrificial layer 14L has a superlattice structure 14L2 composed of alternatively stacked layers (a, b) of two different semiconductor materials. In one embodiment, and when the semiconductor substrate 12 is composed of silicon, the superlattice structure 14L2 is composed of alternating layers of Si (a) and a germanium-containing semiconductor material (b) with a layer of the germanium-containing semiconductor material as the uppermost layer. Each layer in the superlattice structure 14L2 has a thickness from 0.5 nm to 3 nm, although lesser and greater thicknesses can also be employed. In one embodiment, the germanium-containing semiconductor material (b) is silicon germanium.

In some embodiments of the present disclosure, the sacrificial layer 14L may have a same crystallographic orientation as that of the semiconductor substrate 12. In another embodiment, the sacrificial layer 14L may have a different crystallographic orientation from that of the semiconductor substrate 12.

The sacrificial layer 14L can be formed utilizing a deposition process. Examples of deposition processes that can be used in forming the sacrificial layer 14L include, but are not limited to, chemical vapor deposition (CVD), plasma enhanced chemical vapor deposition (PECVD), molecular-beam epitaxy (MBE), metal organic chemical-vapor deposition (MOCVD), and atomic layer deposition (ALD).

The sacrificial layer 14L that is formed has a thickness typically from 3 to 10 nm. Other thicknesses that are lesser than or greater than the aforementioned range for the sacrificial layer 14L can also be employed in the present disclosure. A thinner sacrificial layer 14L is generally required for electrostatics; whereas a thicker sacrificial layer 14L is generally needed for series resistance.

A number of different sources may be used for forming the sacrificial layer 14L. In some embodiments, in which the sacrificial layer 14L is composed of silicon, the silicon gas source for epitaxial deposition may be selected from the group consisting of hexachlorodisilane ($Si_2Cl_6$), tetrachlorosilane ($SiCl_4$), dichlorosilane ($Cl_2SiH_2$), trichlorosilane ($Cl_3SiH$), methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$), hexamethyldisilane (($CH_3$)$_6Si_2$) and combinations thereof. In some embodiments, in which the sacrificial layer 14L is composed of germanium, the germanium gas source for epitaxial deposition may be selected from the group consisting of germane ($GeH_4$), digermane ($Ge_2H_6$), halogermane, dichlorogermane, trichlorogermane, tetrachlorogermane and combinations thereof. In some embodiments, in which the sacrificial layer 14L is composed of silicon germanium, the silicon sources for epitaxial deposition may be selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof, and the germanium gas sources may be selected from the group consisting of germane, digermane, halogermane, dichlorogermane, trichlorogermane, tetrachlorogermane and combinations thereof.

The channel layer 16L is subsequently deposited on the sacrificial layer 14L as a blanket layer. The channel layer 16L can be composed of any semiconductor material that has a different etch rate than the semiconductor material of the sacrificial layer 14L. In one embodiment, and when the semiconductor thin film 14L1 or the topmost layer of the superlattice structure 14L2 is composed of a germanium-containing semiconductor material, the channel layer 16L can be composed of silicon or silicon germanium with a lower germanium content than that of the sacrificial layer 14L, and if silicon germanium is employed as the channel layer 16L, the germanium content in the channel layer 16L is typically at least 10 wt % lower than that in the sacrificial layer 14L. In some embodiments of the present disclosure, when the semiconductor structure is a pFET, the channel layer 16L can include silicon germanium with a germanium content ranging from 10 wt % to 30 wt % and the sacrificial layer can include silicon germanium with a germanium content ranging from 20 wt % to 40 wt %. In other embodiments, when the semiconductor structure is an nFEF, the channel layer 16L can include silicon and the sacrificial layer can include silicon germanium.

The channel layer 16L can be formed utilizing a deposition process. Examples of deposition processes that can be used in forming the sacrificial layer 16L include, but are not limited to, CVD, PECVD, and ALD. Same material sources used for forming the sacrificial layer 14L can be employed to form the channel layer 16L.

The channel layer 16L that is formed has a thickness typically from 1 nm to 10 nm, although lesser and greater thicknesses can also be employed. When the channel layer 16L is composed of silicon, a thickness for this silicon layer is at least about 3 nm to ensure an inversion layer is contained in the silicon layer.

Figure 3:
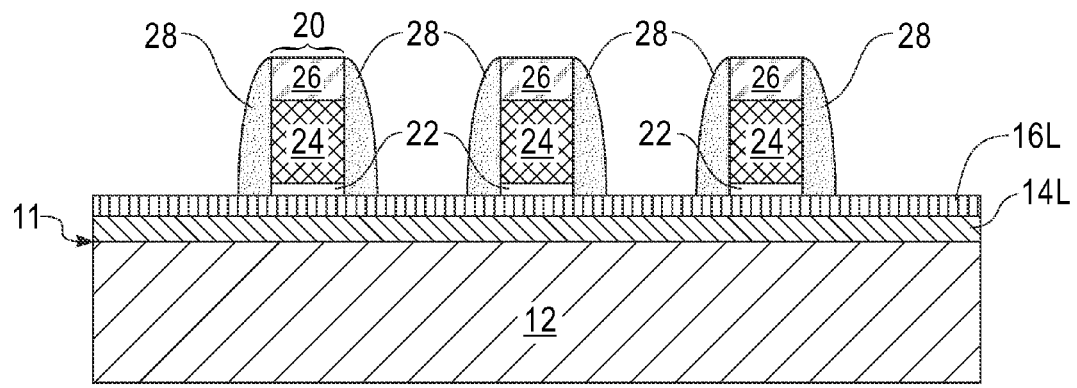
FIG. 3 is a cross-sectional view of the structure of FIG. 1 after forming a plurality of gate structures over the channel layer and a spacer located on a vertical sidewall of each of the gate structures.

Referring now to FIG. 3 a plurality of gate structures 20 are formed on the channel layer 16L shown in FIG. 1. Although a plurality of gate structures 20 are described and illustrated, the method of the present disclosure works equally well when only a single gate structure is formed on the uppermost surface of the semiconductor substrate.

In some embodiments of the present disclosure, each gate structure 20 may have a same conductivity, i.e., nFETs or pFETs. In another embodiment, a first set of gate structures 20 may have a first conductivity, i.e., nFETs or pFETs, and a second set of gat structures 20 may have a second conductivity which is opposite from the first conductivity (i.e., nFETs or pFETs not present in the first set).

Each gate structure 20 includes a material stack of, from bottom to top, a gate dielectric layer portion 22, a gate conductor layer portion 24, and an optional hard mask material layer portion 26. In some embodiments, the optional hard mask material layer portion 26 can be omitted. Each gate structure 20 may contain other materials including but not limited to work function adjusting materials.

The gate dielectric layer portion 22 of each gate structure 20 can be composed of a dielectric material such as, for example, silicon oxide, silicon nitride, silicon oxynitride, a dielectric metal oxide or any multilayered stack thereof. Exemplary dielectric metal oxides that can be employed in the present disclosure as the gate dielectric layer portion 22 include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The dielectric metal oxides typically have a dielectric constant that is greater than that of silicon oxide. The thickness of the gate dielectric layer portion can be from 1 nm to 20 nm. Other thicknesses that are lesser than or greater than the aforementioned range for the gate dielectric layer portion 22 can also be employed in the present disclosure. In some embodiments, each gate structure 20 includes a same gate dielectric layer portion 22. In other embodiments, a first set of gate structures can comprise a first gate dielectric layer portion, while a second set of gate structures can comprise a second gate dielectric portion, wherein said second gate dielectric portion comprises at least one different gate dielectric material than the first gate dielectric portion.

The gate conductor layer portion 24 of each gate structure 20 can be composed of a conductive material including, for example, doped polysilicon, a doped silicon germanium alloy, an elemental metal, an alloy containing at least two elemental metals, a metal semiconductor alloy and any multilayered combination thereof. The thickness of the gate conductor layer portion 16 can be from 50 nm to 150 nm. Other thicknesses that are lesser than or greater than the aforementioned range for the gate conductor layer portion 24 can also be employed in the present disclosure. In some embodiments, each gate structure 20 includes a same gate conductor layer portion 24. In other embodiments, a first set of gate structures can comprise a first gate conductor portion, while a second set of gate structures can comprise a second gate conductor portion, wherein said second gate conductor portion comprises at least one different gate conductor material than the first gate conductor portion.

If present, the hard mask material layer portion 26 can be composed of a dielectric material including, for example, silicon oxide, silicon nitride, silicon oxynitride or multilayered stacks thereof. When present, the thickness of the hard mask material layer portion 26 can be from 20 nm to 100 nm. Other thicknesses that are lesser than or greater than the aforementioned range for the hard mask material layer portion 26 can also be employed in the present disclosure.

The gate structures 20 can be formed utilizing any technique known in the art. For example, and in one embodiment, the gate structures 20 can be formed by blanket depositing various material layers, and then patterning those material layers by lithography and etching.

Figure 7:
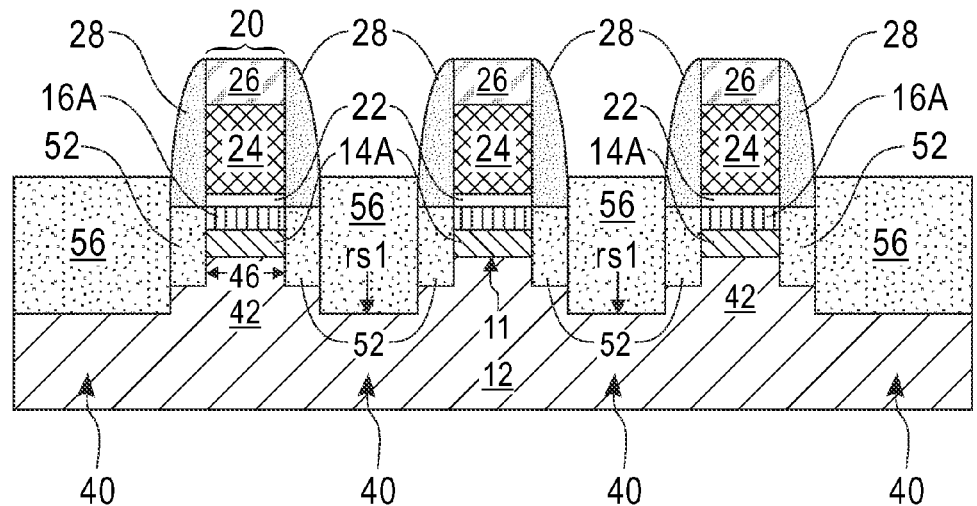
FIG. 7 is a cross-section view of the structure of FIG. 6 after diffusing dopants in the doped semiconductor material into portions of the channel layer portion over the lateral recesses and portions of the semiconductor substrate adjacent the lateral recesses to form source/drain extension regions.

In some embodiments, each gate structure 20 can be a sacrificial gate structure (not shown). The term "sacrificial gate structure" as used herein denotes a material that serves as a placeholder structure for a functional gate structure to be subsequently formed. The term "functional gate structure" as used herein denotes a permanent gate structure used to control output current (i.e., flow of carriers in the channel) of a semiconducting device through electrical or magnetic fields. The sacrificial gate structure can be formed by first providing a blanket layer of a sacrificial gate material. The blanket layer of sacrificial gate material can include any material that can be selectively removed from the structure during a subsequently performed etching process. In one embodiment, the blanket layer of sacrificial gate material may be composed of polysilicon. In another embodiment, the blanket layer of sacrificial gate material may be composed of a metal such as, for example, Al, W, or Cu. After providing the blanket layer of sacrificial gate material, the blanket layer of sacrificial gate material can be patterned by lithography and etching so as to form the sacrificial gate structure. The sacrificial gate structure can be replaced with a function gate structure after forming the source/drain extension regions of the present disclosure as shown in FIG. 7.

The structure shown in FIG. 3 also includes a spacer 28 located on each vertical sidewall of each gate structure 20. The spacer 28 has a base in contact with the channel layer 16L. The spacers 28 can be composed of a dielectric insulating material such as, for example, silicon oxide, silicon nitride, or silicon oxynitride. In some embodiments, the spacers 28 can be composed of a same material as that of the hard mask layer portions 26. In other embodiments, the spacers 28 can be composed of a different material as that of the hard mask material layer portions 26. The spacers 28 can be formed by deposition and etching. In some embodiments, the spacers 28 are formed after formation of each gate structure 20. In other embodiments, and typically when a replacement gate structure is employed, the spacers 28 are formed prior to formation of each gate structure 20. The thickness of each spacer 28, as measured from its base, can be from 1 nm to 20 nm. Other thicknesses that are lesser than or greater than the aforementioned range for the spacer 28 can also be employed in the present disclosure. In one example, the thickness of the spacer 28 that is employed in the present disclosure is 5 nm.

In some embodiments of the present disclosure, the pitch of the gate structures, i.e., the distance from a central portion of one gate structure to a central portion of its nearest neighboring gate structure, is from 100 nm or less. In other embodiments, the pitch of the gate structures is from 55 nm or less.

Figure 4:
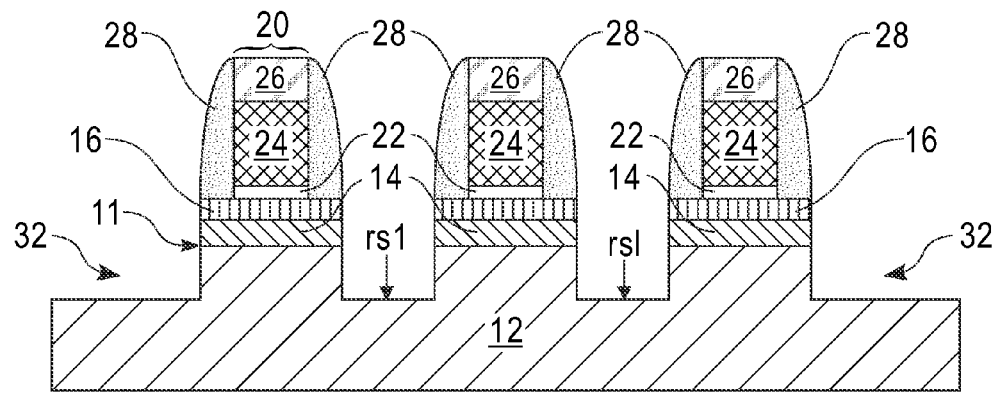
FIG. 4 is a cross-sectional view of the structure of FIG. 3 after recessing exposed portions of the channel layer and portions of the sacrificial layer and semiconductor substrate located beneath the exposed portions of the channel layer utilizing the gate structures and the spacers as an etch mask.

Referring now to FIG. 4, there is illustrated the structure of FIG. 3 after forming source/drain trenches 32 within the structure by utilizing the spacers 28 and the gate structures 20 as an etch mask and removing exposed portions of the channel layer 16L together with underlying portions of the sacrificial layer 14L and the semiconductor substrate 12. This step provides source/drain trenches 32 each with a recess surface, $rs_1$, within the semiconductor substrate 12. The recess surface, $rs_1$, is deeper than the original uppermost surface 11 of the semiconductor substrate 12. Stated in other terms, the recessed surface, $rs_1$, is located below and vertically offset from the uppermost surface 11 of the non-etched portions of the semiconductor substrate 12. The remaining portions of the channel layer 16L that remain directly beneath the spacers 28 and the gate structures 20 are referred to herein as channel layer portions 16, while the remaining portions of the sacrificial layer 14L that remain directly beneath the channel layer portions 16 are referred to herein as sacrificial layer portions 14. The source/drain trenches 32 can be formed in the present disclosure by utilizing at least one etch.

In one embodiment of the present disclosure, the at least one recess etch may include a dry etching process (including for example, reactive ion etching, plasma etching or ion beam etching) or a wet chemical etching process. In some embodiments, the at least one recess etch may include a crystallographic wet etch process. Examples of suitable wet etchants that can be employed in this recess etch step include, but are not limited to, KOH, tetramethylammonium hydroxide (TMAH), ethylene diamine pyrocatechol (EDP), $N_2H_4$, NaOH, and CsOH. Typically, a plasma etch such as, for example, a low energy downstream radical etching process is employed as the recess etch.

Specifically, at least one recess etch that selectively removes semiconductor materials of the channel layer 16L, the sacrificial layer 14L and the semiconductor substrate 12 with respect to the materials of the spacers 28 and the gate structures 20 is employed to provide the structure shown in FIG. 4. As used herein, the term "selective" in reference to a material removal process denotes that the rate of material removal for a first material is greater than the rate of removal for at least another material of the structure to which the material removal process is being applied. For example and in one embodiment, a selective etch may include an etch chemistry that removes a first material selectively to a second material by a ratio of 10:1 or greater.

Figure 5:
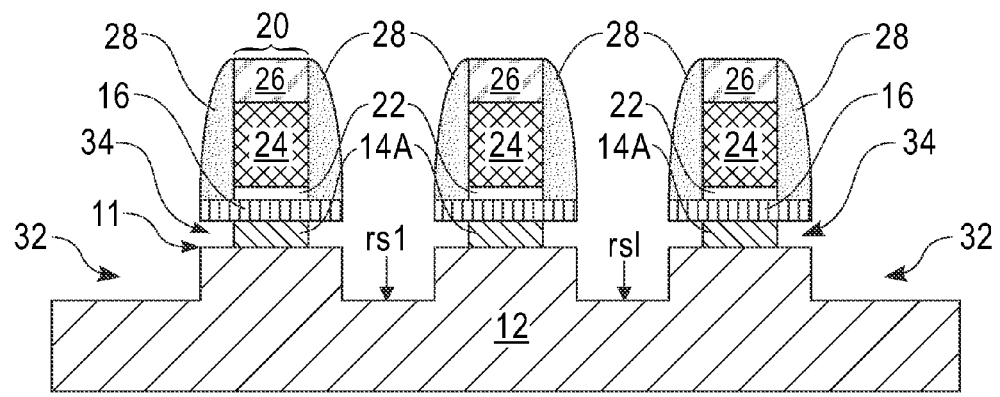
FIG. 5 is a cross-sectional view of the structure FIG. 4 after laterally recessing sacrificial layer portions to form a lateral recess on each side of the sacrificial layer portions.

Referring now to FIG. 5, there is illustrated the structure of FIG. 4 after laterally etching (i.e., undercutting) and removing portions of the sacrificial layer portions 14 to provide lateral recesses 34. As is shown, the sidewalls of the sacrificial layer portions 14 are laterally recessed selectively with respect to the channel layer portions 16 and the semiconductor substrate 12 by a lateral distance. The lateral distance typically is chosen no greater than the thickness of the spacer 28. In one embodiment and as shown in FIG. 5, the lateral distance is substantially the same as the thickness of the spacer 28. The remaining portions of the sacrificial layer portions 14 after the lateral undercut are referred to herein as recessed sacrificial layer portions 14A.

The lateral recesses 34 can be formed by utilizing RCA clean, HCl vapor etch, or low temperature high pressure oxidation (HiPOX) that allows precise control of the lateral undercut. By "low temperature" it is meant that the temperature of the etching process ranges from 550° C. to 700° C.

In one embodiment in which the sacrificial layer portions 14 comprise a germanium-containing material, and both channel layer portions 16 and the semiconductor substrate 12 comprise Si, an RCA clean can be used. RCA clean is a standard set of wafer cleaning steps which is performed before high-temperature processing steps. The RCA clean includes a first step of removal of organic contaminants (Organic Clean), a second step of removal of a thin oxide layer (Oxide Strip); and a third step of removal of ionic contaminations (Ionic Clean). Typically, the RCA clean comprises a first step (called SC-1, where SC stands for standard clean) in which the structure is contacted with a 1:1:5 solution of $NH_4OH$ (ammonium hydroxide)+$H_2O_2$ (hydrogen peroxide)+$H_2O$ (water) at 75° C. or 80° C. typically for 10 minutes. This treatment results in the formation of a thin silicon dioxide layer (about 10 Angstrom) on the silicon surface, along with a certain degree of metallic contamination that shall be removed in subsequent steps. Next, a second step is performed by immersing the structure in a 1:50 solution of $HF+H_2O$ at 25° C., in order to remove the thin oxide layer and some fraction of ionic contaminants. The third and last step (called SC-2) is performed by contacting the structure with a 1:1:6 solution of $HCl+H_2O_2+H_2O$ at 75° C. or 80° C. This treatment effectively removes the remaining traces of metallic (ionic) contaminants.

In one embodiment in which the sacrificial layer portions 14 comprise a germanium-containing material, and both the channel layer portions 16 and the semiconductor substrate 12 comprise Si, an etch using HCl vapor can be performed at a temperature range of 600° C. to 800° C.

In one embodiment in which the sacrificial layer portions 14 comprise a germanium-containing material, and both the channel layer portions 16 and the semiconductor substrate 12 comprise Si, another selective removal process using a HIPOX process at a temperature range of 550° C.-700° C. followed by a DHF oxide removal can be performed.

Figure 6:
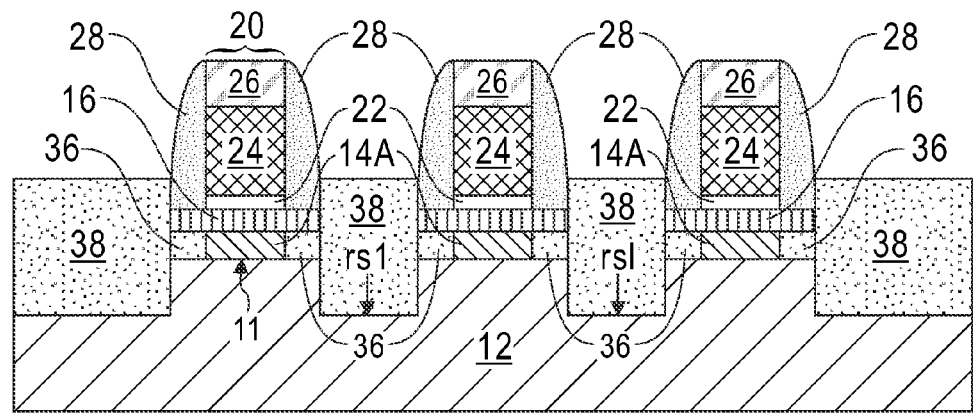
FIG. 6 is a cross-sectional view of the structure of FIG. 5 after depositing a doped semiconductor material within the source/drain trenches and the lateral recesses.

Referring now to FIG. 6, there is illustrated the structure of FIG. 5 after forming a doped semiconductor material within the source/drain trenches 32 and the lateral recesses 34. The portions of the doped semiconductor material that is within the lateral recesses 34 can be referred to herein as a first doped semiconductor material region 36. A shallow junction is thus defined by a total thickness of the sacrificial layer 14L and the channel layer 16L. The other portions of the doped semiconductor material that are formed outside the lateral recesses 34 and directly within the source/drain trenches 32 can be referred to herein as a second doped semiconductor material region 38.

The doped semiconductor material can be formed utilizing an epitaxial growth process in which an in-situ doped semiconductor material is formed. In an in-situ doping process, the dopant is added during the deposition of the semiconductor material.

"Epitaxially growing, epitaxial growth and/or deposition" mean the growth of a semiconductor material on a deposition surface of a semiconductor material, in which the semiconductor material being grown has the same crystalline characteristics as the semiconductor material of the deposition surface. In the present embodiment, the semiconductor material used in forming the first doped semiconductor material region 36 and the second doped semiconductor material region 38 has the same crystalline characteristics as that of the exposed recessed surface $rs_1$ of the semiconductor substrate 12. When the chemical reactants are controlled and the system parameters set correctly, the depositing atoms arrive at the deposition surface with sufficient energy to move around on the surface and orient themselves to the crystal arrangement of the atoms of the deposition surface. Thus, an epitaxial film deposited on a {100} crystal surface will take on a {100} orientation. In some embodiments, the epitaxial deposition process is a selective deposition process.

The semiconductor material that can be epitaxially deposited includes any semiconductor material such as, for example, silicon, germanium, and silicon germanium. In one embodiment, the semiconductor material that is epitaxially deposited includes a same semiconductor material as that of semiconductor substrate 12. In another embodiment, the semiconductor material includes a different semiconductor material as that of the semiconductor substrate 12. It is noted that the specific material compositions for the semiconductor material are provided for illustrative purposes only, and are not intended to limit the present disclosure, as any semiconductor material that may be formed using an epitaxial growth process.

Same material sources used for forming the sacrificial layer 14L in FIG. 1 can be employed to form the first doped semiconductor material region 36 and the second doped semiconductor material region 38. Typical gas precursors for in-situ doping include diborane ($B_2H_6$) for a p-type dopant or arsine ($AsH_3$) or phosphine ($PH_3$) for an n-type dopant.

The temperature for epitaxial semiconductor deposition typically ranges from 550° C. to 1300° C. The apparatus for performing the epitaxial growth may include a CVD apparatus, such as atmospheric pressure CVD (APCVD), low pressure CVD (LPCVD), plasma enhanced CVD (PECVD), MOCVD, RTCVD and others.

The first doped semiconductor material region 36 and the second doped semiconductor material region 38 that are formed can have a dopant concentration from $10^{21}$ atoms/cm$^3$ or greater.

Referring now to FIG. 7, there is illustrated the structure of FIG. 6 after forming source/drain regions 52 and source/drain extension regions 56. A subsequent drive-in anneal is performed to activate dopants. The temperature for the drive-in anneal typically ranges from 600° C. to 1400° C. The annealing process drives dopants from the doped semiconductor material into portions of the semiconductor substrate 12 adjacent the first doped semiconductor material region 36 and portions of the channel layer portions 16 located over first doped semiconductor material region 36. The junction depth thus is increased by an amount of dopants diffused into the channel layer portions 16 and the semiconductor substrate 12. The junction depth typically is in the range from 6 nm to 16 nm, and a smaller junction depth generally is more desirable. The amount of the dopants diffused into the channel layer portions 16 and the semiconductor substrate 12 is determined by the trade-off between the link-up resistance, the parasitic capacitance, and the short-channel effect (SCE). The doped regions in the semiconductor substrate and the doped regions in the channel layer portions 16 together with the first doped semiconductor material regions 36 define source/drain extension regions 52. The source/drain extension regions 52 are of unitary construction as no interfaces are present between adjacent doped regions. The remaining undoped portions of the channel layer portions 16 after the anneal are referred to herein as channel regions 16A.

After the annealing process, the doped semiconductor material in the source/drain trench regions 38 can be referred to herein as the source/drain regions 56. The source/drain extension regions 52 and the source/drain regions 56 are of unitary construction; as such no interface is present between the two regions.

Specifically, FIG. 7 illustrates the resultant semiconductor structure of the present disclosure. The structure includes a semiconductor substrate 12 comprising at least one mesa semiconductor structure 42 and adjoining recessed surface semiconductor portions 40. The at least one mesa semiconductor structure 42 includes a first doping region located at each side of the uppermost portion of the at least one mesa semiconductor structure 42. A recessed sacrificial layer portion 14A is located on the topmost surface 11 of an undoped portion 46 of the at least one mesa semiconductor structure 42. A channel layer portion 16 having a channel region 16A is located on the recessed sacrificial layer portion 14A. The channel layer portion 16 also contains a second doped region located at each side of the channel region 16A. A first doped semiconductor material region 36 is located within a laterally recess on each side of the recessed sacrificial layer portion 14A. A bottommost surface of the first doped semiconductor material region 36 is in contact with at least the first doped region in the mesa semiconductor structure 24 and an uppermost surface of the first doped semiconductor region 36 is in contact with at least the second doped region in the channel layer portion 16. The first doped region, the first doped semiconductor material region 36 and the second doped region define a source/drain extension region 52. A gate structure 20 is located on the channel region 16A. A spacer 28 is present on vertical sidewalls of gate structure 20 and has a base in contact with at least the second doping region D2. A source/drain region 56 is located on each of the recessed surface semiconductor portions 40 of the semiconductor substrate 12. In accordance with the present disclosure, the source/drain region 56 and the source/drain extension region 52 are of unitary construction and comprise a same doped semiconductor material. In the disclosed structure shown in FIG. 7, the source/drain extension region 52 has a width substantially equal to the thickness of the spacer 28.

In some embodiments of the present disclosure, any combinations including both of the source/drain extension region 52 and the source/drain region 56 may include either carbon up to 50% content or germanium up to 85% content in order to induce uniaxial strain to channel region 16A thereby improving the carrier mobility of either electrons or holes in the strained channel region 16A.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming a semiconductor structure comprising:
   forming a sacrificial layer on a semiconductor substrate;
   forming a channel layer on the sacrificial layer;
   providing at least one gate structure on the channel layer, said at least one gate structure having a spacer located on each of vertical sidewalls of said at least one gate structure;
   recessing exposed portions of said channel layer and portions of said sacrificial layer and said semiconductor substrate located beneath said exposed portions of said channel layer utilizing said at least one gate structure and said spacer as an etch mask, wherein the recessing forms trenches in said semiconductor substrate;
   laterally recessing a remaining portion of said sacrificial layer selectively with respect to said channel layer and said semiconductor substrate by a lateral distance to provide a lateral recess in each side of said remaining portion of said sacrificial layer;
   depositing a doped semiconductor material in said trenches and said lateral recesses; and
   annealing the doped semiconductor material, wherein during the annealing dopants of the semiconductor material diffuse into portions of said semiconductor substrate adjacent said lateral recesses to form a first doped region and into portions of said channel layer over said lateral recesses to form a second doped region.

2. The method of claim 1, wherein said sacrificial layer comprises a semiconductor material that has a different etch rate than a semiconductor material of said channel layer and a semiconductor material of said semiconductor substrate.

3. The method of claim 2, wherein said semiconductor substrate comprises silicon, said channel layer comprises silicon or silicon germanium, and said sacrificial layer comprises a germanium-containing semiconductor material selected from a silicon germanium alloy, pure germanium, doped germanium and multilayers thereof, wherein the silicon germanium in the channel layer has a germanium content at least 10 wt % lower than that of the sacrificial layer.

4. The method of claim 2, wherein said sacrificial layer comprises a superlattice structure of alternating layers of a first semiconductor material and a second semiconductor material.

5. The method of claim 4, wherein said first semiconductor material comprises silicon and said second semiconductor material comprises a silicon germanium alloy.

6. The method of claim 1, wherein said lateral distance is no greater than a thickness of said spacer.

7. The method of claim 1, wherein said laterally recessing the remaining portion of said sacrificial layer is performed utilizing a RCA clean, a HCl vapor etch, or a high pressure oxidation (HIPOX).

8. The method of claim 1, wherein said recessing the exposed portions of the sacrificial layer, portion of the channel layer and portions of the semiconductor substrate located beneath the exposed portions of the sacrificial layer is performed utilizing a wet chemical etching process or a plasma process.

9. The method of claim 1, wherein said depositing the doped semiconductor material comprises an epitaxial growth.

10. The method of claim 1, wherein said annealing is performed at a temperature ranging from 600° C. to 1400° C.

11. The method of claim 1, wherein after said annealing, a portion of said doped semiconductor material located in each of said lateral recesses, a respective said first doped region and a respective said second doped region define a source/drain extension region, and wherein another portion of said doped semiconductor material located in each of said trenches in the semiconductor substrate defines a source/drain region, and wherein said source/drain extension region and said source/drain region are of unitary construction.

12. The method of claim 1, wherein during annealing, dopants of said doped semiconductor material diffuse to an uppermost surface of said channel layer and are in contact with said base of the spacer.

13. The method of claim 1, further comprising replacing said at least one gate structure with at least one functional gate structure after said annealing.

14. A semiconductor structure comprising:
   a semiconductor substrate comprising at least one mesa semiconductor structure and adjoining recessed surface semiconductor portions, wherein said at least one mesa semiconductor structure includes a first doped region at each side of an uppermost portion of said at least one mesa semiconductor structure;
   a sacrificial layer portion located on an undoped portion of an uppermost surface of said at least one mesa semiconductor structure, wherein said sacrificial layer portion is laterally offset with respect to sidewalls of said mesa semiconductor structure to form a lateral recess on each side of the sacrificial layer portion;
   a channel layer portion located on said sacrificial layer portion, wherein said channel layer portion includes a channel region in contact with said sacrificial layer portion and a second doped region located on portions of lateral protrusions of said channel layer portion with respect to said sacrificial layer portion;
   a first doped semiconductor material region located within each of said lateral recesses, wherein a bottommost surface of said first doped semiconductor material region is in contact with at least said first doped region and an uppermost surface of said first doped semiconductor material region is in contact with at least said second doped region;
   a gate structure located on said channel region of the channel layer portion, wherein said gate structure includes a spacer present on each of vertical sidewalls of said gate structure, said spacer having a base present on at least said second doped region; and
   a second doped semiconductor material region located on each of the recessed surface semiconductor portions of said semiconductor substrate, wherein said second doped semiconductor material region comprises a same doped semiconductor material as that of said first doped semiconductor material region,
   wherein said first doped region, said second doped region and said first doped semiconductor material region define a source/drain extension region, and wherein said first doped region and said second doped region are formed by diffusing dopants from said doped semiconductor material into respective portions of said channel layer portion and said at least one mesa semiconductor structure during annealing, and
   wherein said second doped semiconductor material region defines a source/drain region.

15. The semiconductor structure of claim 14, wherein an outermost edge of said spacer is vertical coincident to an uppermost section of said at least one mesa semiconductor structure.

16. The semiconductor structure of claim 14, wherein said spacer has a thickness from 1 nm to 20 nm.

17. The semiconductor structure of claim 14, wherein said lateral recess has a depth no greater than a thickness of said spacer.

18. The semiconductor structure of claim 14, wherein said sacrificial layer portion comprises a semiconductor material that has a different etch rate than a semiconductor material of said channel layer portion and a semiconductor material of said semiconductor substrate.

19. The semiconductor structure of claim 14, wherein said semiconductor substrate comprises silicon, said channel layer portion comprises silicon or silicon germanium, and said sacrificial layer portion comprises a germanium-containing semiconductor material selected from a silicon germanium alloy, pure germanium, doped germanium and multilayers thereof, wherein the silicon germanium in the channel layer has a germanium content at least 10 wt % lower than that of the sacrificial layer.

20. The semiconductor structure of claim 18, wherein said sacrificial layer portion comprises a superlattice structure of alternating layers of silicon and a germanium-containing semiconductor material selected from a silicon germanium alloy, pure germanium, doped germanium and multilayers thereof.

\* \* \* \* \*